United States Patent
Saxby

(10) Patent No.: US 11,442,114 B2
(45) Date of Patent: Sep. 13, 2022

(54) OVERHEAD POWER LINE SENSOR

(71) Applicant: Sentient Technology Holdings, LLC, Wichita, KS (US)

(72) Inventor: Dennis Allen Saxby, Los Gatos, CA (US)

(73) Assignee: Sentient Technology Holdings, LLC, Wichita, KS (US)

( * ) Notice: Subject to any disclaimer, the term of this patent is extended or adjusted under 35 U.S.C. 154(b) by 0 days.

(21) Appl. No.: 16/858,719

(22) Filed: Apr. 27, 2020

(65) Prior Publication Data

US 2020/0256927 A1 Aug. 13, 2020

Related U.S. Application Data

(63) Continuation of application No. 15/818,512, filed on Nov. 20, 2017, now Pat. No. 10,634,733.

(Continued)

(51) Int. Cl.
| | |
|---|---|
| *G01R 15/14* | (2006.01) |
| *G01R 19/25* | (2006.01) |
| *G01R 19/00* | (2006.01) |
| *G01R 31/58* | (2020.01) |
| *G01R 1/067* | (2006.01) |

(Continued)

(52) U.S. Cl.
CPC ........... *G01R 31/58* (2020.01); *G01R 15/142* (2013.01); *G01R 19/2513* (2013.01); *G01R 31/085* (2013.01); *H04B 3/46* (2013.01)

(58) Field of Classification Search
CPC ...... G01R 15/14; G01R 15/142; G01R 15/04; G01R 19/25; G01R 19/2513; G01R 19/00; G01R 19/0084; G01R 31/085; G01R 31/58; G01R 1/067; G01R 1/06777
See application file for complete search history.

(56) References Cited

U.S. PATENT DOCUMENTS

| 3,075,166 A | 1/1963 | Peek |
| 3,558,984 A | 1/1971 | Smith |

(Continued)

FOREIGN PATENT DOCUMENTS

| CN | 204333832 | * 5/2015 | ............... H02G 3/04 |
| EP | 1508146 A2 | 2/2005 | |

(Continued)

OTHER PUBLICATIONS

Chen et al.; Development of arc-guided protection devices against lightning breakage of covered conductors on distribution lines; IEEE Trans. Power Deliv.; 25(1); pp. 196-205; Jan. 2010.

(Continued)

*Primary Examiner* — Neel D Shah

(57) ABSTRACT

A power distribution monitoring system is provided that can include a number of features. The system can include a plurality of power line sensing devices configured to attach to individual conductors on a power grid distribution network. The sensing devices can be configured to measure and monitor, among other things, current values and waveforms, phase voltage, conductor current, phase-to-phase voltage, conductor temperatures, ambient temperatures, vibration, wind speed and monitoring device system diagnostics. Methods of installing and protecting the system are also discussed.

22 Claims, 18 Drawing Sheets

Related U.S. Application Data

(60) Provisional application No. 62/424,271, filed on Nov. 18, 2016.

(51) Int. Cl.
*G01R 31/08* (2020.01)
*H04B 3/46* (2015.01)

(56) References Cited

U.S. PATENT DOCUMENTS

| | | |
|---|---|---|
| 3,676,740 A | 7/1972 | Schweitzer, Jr. |
| 3,686,531 A | 8/1972 | Decker |
| 3,702,966 A | 11/1972 | Schweitzer, Jr. |
| 3,708,724 A | 1/1973 | Schweitzer |
| 3,715,742 A | 2/1973 | Schweitzer |
| 3,720,872 A | 3/1973 | Russell |
| 3,725,832 A | 4/1973 | Schweitzer |
| 3,755,714 A | 8/1973 | Link |
| 3,768,011 A | 10/1973 | Swain |
| 3,777,217 A | 12/1973 | Groce |
| 3,814,831 A | 6/1974 | Olsen |
| 3,816,816 A | 6/1974 | Schweitzer |
| 3,866,197 A | 2/1975 | Schweitzer, Jr. |
| 3,876,911 A | 4/1975 | Schweitzer, Jr. |
| 3,957,329 A | 5/1976 | Mcconnell |
| 3,970,898 A | 7/1976 | Baumann |
| 4,063,161 A | 12/1977 | Pardis |
| 4,152,643 A | 5/1979 | Schweitzer, Jr. |
| 4,339,792 A | 7/1982 | Yasumura |
| 4,378,525 A | 3/1983 | Burdick |
| 4,396,794 A | 8/1983 | Stiller |
| 4,396,968 A | 8/1983 | Stiller |
| 4,398,057 A | 8/1983 | Shankle |
| 4,408,155 A | 10/1983 | Mcbride |
| 4,466,071 A | 8/1984 | Russell, Jr. |
| 4,559,491 A | 12/1985 | Saha |
| 4,570,231 A | 2/1986 | Bunch |
| 4,584,523 A | 4/1986 | Elabd |
| 4,649,457 A | 3/1987 | Talbot |
| 4,654,573 A | 3/1987 | Rough |
| 4,709,339 A | 11/1987 | Fernandes |
| 4,714,893 A | 12/1987 | Smith-Vaniz |
| 4,723,220 A | 2/1988 | Smith-Vaniz |
| 4,728,887 A | 3/1988 | Davis |
| 4,746,241 A | 5/1988 | Burbank, III |
| 4,766,549 A | 8/1988 | Schweitzer, III |
| 4,775,839 A | 10/1988 | Kosina |
| 4,808,916 A | 2/1989 | Smith-Vaniz |
| 4,823,022 A | 4/1989 | Lindsey |
| 4,827,272 A | 5/1989 | Davis |
| 4,829,298 A | 5/1989 | Fernandes |
| 4,881,028 A | 11/1989 | Bright |
| 4,886,980 A | 12/1989 | Fernandes |
| 4,904,932 A | 2/1990 | Schweitzer, Jr. |
| 4,937,769 A | 6/1990 | Verbanets |
| 5,006,846 A | 4/1991 | Granville |
| 5,103,111 A | 4/1992 | Tobin et al. |
| 5,125,738 A | 6/1992 | Kawamura |
| 5,138,265 A | 8/1992 | Kawamura |
| 5,159,561 A | 10/1992 | Watanabe |
| 5,181,026 A | 1/1993 | Granville |
| 5,182,547 A | 1/1993 | Griffith |
| 5,202,812 A | 4/1993 | Shinoda |
| 5,206,595 A | 4/1993 | Wiggins |
| 5,220,311 A | 6/1993 | Schweitzer, Jr. |
| 5,252,913 A | 10/1993 | Falkowski |
| 5,428,549 A | 6/1995 | Chen |
| 5,438,256 A | 8/1995 | Thuries |
| 5,473,244 A | 12/1995 | Libove |
| 5,495,169 A | 2/1996 | Smith |
| 5,550,476 A | 8/1996 | Lau |
| 5,565,783 A | 10/1996 | Lau |
| 5,600,248 A | 2/1997 | Westrom |
| 5,608,328 A | 3/1997 | Sanderson |
| 5,650,728 A | 7/1997 | Rhein |
| 5,656,931 A | 8/1997 | Lau |
| 5,682,100 A | 10/1997 | Rossi |
| 5,696,788 A | 12/1997 | Choi |
| 5,698,831 A | 12/1997 | Abdelgawad et al. |
| 5,712,796 A | 1/1998 | Ohura |
| 5,729,144 A | 3/1998 | Cummins |
| 5,737,203 A | 4/1998 | Barrett |
| 5,764,065 A | 6/1998 | Richards |
| 5,839,093 A | 11/1998 | Novosel |
| 5,892,430 A | 4/1999 | Wiesman |
| 5,905,646 A | 5/1999 | Crewson |
| 5,990,674 A | 11/1999 | Schweitzer, Jr. |
| 6,002,260 A | 12/1999 | Lau |
| 6,016,105 A | 1/2000 | Schweitzer, Jr. |
| 6,043,433 A | 3/2000 | Schweitzer, Jr. |
| 6,133,723 A | 10/2000 | Feight |
| 6,133,724 A | 10/2000 | Schweitzer, Jr. |
| 6,288,632 B1 | 9/2001 | Hoctor |
| 6,292,340 B1 | 9/2001 | Oregan |
| 6,347,027 B1 | 2/2002 | Nelson |
| 6,433,698 B1 | 8/2002 | Schweitzer, Jr. |
| 6,459,998 B1 | 10/2002 | Hoffman |
| 6,466,030 B2 | 10/2002 | Hu |
| 6,466,031 B1 | 10/2002 | Hu |
| 6,477,475 B1 | 11/2002 | Takaoka |
| 6,483,435 B2 | 11/2002 | Saha |
| 6,529,013 B2 | 3/2003 | Skendzic et al. |
| 6,538,422 B2 | 3/2003 | Potter et al. |
| 6,549,880 B1 | 4/2003 | Willoughby |
| 6,559,651 B1 | 5/2003 | Crick |
| 6,566,854 B1 | 5/2003 | Hagmann |
| 6,577,108 B2 | 6/2003 | Hubert |
| 6,601,001 B1 | 7/2003 | Moore |
| 6,622,285 B1 | 9/2003 | Rust |
| 6,677,743 B1 | 1/2004 | Coolidge |
| 6,717,395 B2 | 4/2004 | Skendzic et al. |
| 6,718,271 B1 | 4/2004 | Tobin |
| 6,734,662 B1 | 5/2004 | Fenske |
| 6,798,211 B1 | 9/2004 | Rockwell |
| 6,822,457 B2 | 11/2004 | Borchert |
| 6,822,576 B1 | 11/2004 | Feight |
| 6,879,917 B2 | 4/2005 | Turner |
| 6,894,478 B1 | 5/2005 | Fenske |
| 6,914,763 B2 | 7/2005 | Reedy |
| 6,917,888 B2 | 7/2005 | Logvinov |
| 6,927,672 B2 | 8/2005 | Zalitzky |
| 6,949,921 B1 | 9/2005 | Feight |
| 6,963,197 B1 | 11/2005 | Feight |
| 6,980,090 B2 | 12/2005 | Mollenkopf |
| 7,023,691 B1 | 4/2006 | Feight |
| 7,046,124 B2 | 5/2006 | Cope |
| 7,053,601 B1 | 5/2006 | Fenske |
| 7,072,163 B2 | 7/2006 | Mccollough, Jr. |
| 7,076,378 B1 | 7/2006 | Huebner |
| 7,085,659 B2 | 8/2006 | Peterson |
| 7,106,048 B1 | 9/2006 | Feight |
| 7,123,032 B2 | 10/2006 | Yakymyshyn et al. |
| 7,158,012 B2 | 1/2007 | Wiesman |
| 7,187,275 B2 | 3/2007 | McCollough, Jr. |
| 7,203,622 B2 | 4/2007 | Pan |
| 7,272,516 B2 | 9/2007 | Wang |
| 7,295,133 B1 | 11/2007 | McCollough, Jr. |
| 7,400,150 B2 | 7/2008 | Cannon |
| 7,424,400 B2 | 9/2008 | McCormack |
| 7,449,991 B2 | 11/2008 | Mollenkopf |
| 7,450,000 B2 | 11/2008 | Gidge |
| 7,508,638 B2 | 3/2009 | Hooper |
| 7,518,529 B2 | 4/2009 | Osullivan |
| 7,532,012 B2 | 5/2009 | Cern |
| 7,557,563 B2 | 7/2009 | Gunn |
| 7,626,794 B2 | 12/2009 | Swartzendruber |
| 7,633,262 B2 | 12/2009 | Lindsey |
| 7,672,812 B2 | 3/2010 | Stoupis |
| 7,683,798 B2 | 3/2010 | Rostron |
| 7,701,356 B2 | 4/2010 | Curt |
| 7,714,592 B2 | 5/2010 | Radtke |
| 7,720,619 B2 | 5/2010 | Hou |
| 7,725,295 B2 | 5/2010 | Stoupis |
| 7,742,393 B2 | 6/2010 | Bonicatto |

(56) References Cited

U.S. PATENT DOCUMENTS

| | | | |
|---|---|---|---|
| 7,764,943 B2 | 7/2010 | Radtke | |
| 7,795,877 B2 | 9/2010 | Radtke | |
| 7,795,994 B2 | 9/2010 | Radtke | |
| 7,804,280 B2 | 9/2010 | Deaver, Sr. | |
| 7,930,141 B2 | 4/2011 | Banting | |
| 8,421,444 B2 | 4/2013 | Gunn | |
| 8,497,781 B2 | 7/2013 | Engelhardt | |
| 8,594,956 B2 | 11/2013 | Banting | |
| 8,786,292 B2 | 7/2014 | Parsons | |
| 8,841,900 B2 | 9/2014 | Javora et al. | |
| 9,182,429 B2 | 11/2015 | Saxby | |
| 9,229,036 B2 | 1/2016 | Kast | |
| 9,335,348 B2 | 5/2016 | Fong et al. | |
| 9,448,257 B2 | 9/2016 | Saxby | |
| 9,581,624 B2 | 2/2017 | Rostron | |
| 2004/0156154 A1 | 8/2004 | Lazarovich | |
| 2005/0073200 A1 | 4/2005 | Divan | |
| 2006/0012382 A1* | 1/2006 | Yakymyshyn | G01R 15/06 324/705 |
| 2008/0077336 A1 | 3/2008 | Fernandes | |
| 2009/0058582 A1 | 3/2009 | Webb | |
| 2009/0309754 A1 | 12/2009 | Bou | |
| 2010/0085036 A1 | 4/2010 | Banting | |
| 2011/0032739 A1 | 2/2011 | Juhlin | |
| 2011/0043214 A1* | 2/2011 | Potter | G01R 31/085 324/525 |
| 2012/0039062 A1 | 2/2012 | Mcbee | |
| 2012/0236611 A1 | 9/2012 | Alexandrov | |
| 2013/0162136 A1 | 6/2013 | Baldwin | |
| 2014/0062221 A1 | 3/2014 | Papastergiou | |
| 2014/0145858 A1 | 5/2014 | Miller | |
| 2014/0174170 A1 | 6/2014 | Davis | |
| 2014/0192458 A1 | 7/2014 | Valdes | |
| 2014/0226366 A1 | 8/2014 | Morokuma | |
| 2014/0260598 A1 | 9/2014 | Miller | |
| 2015/0198667 A1 | 7/2015 | Krekeler | |
| 2016/0061862 A1* | 3/2016 | Nulty | G01R 15/142 324/127 |
| 2016/0116505 A1 | 4/2016 | Kast | |
| 2016/0197470 A1* | 7/2016 | Baker | H02H 9/005 174/2 |
| 2017/0162320 A1 | 6/2017 | Rumrill | |
| 2017/0199533 A1 | 7/2017 | McCollough | |
| 2017/0248892 A1* | 8/2017 | Yamamoto | H01R 13/17 |

FOREIGN PATENT DOCUMENTS

| | | |
|---|---|---|
| EP | 2350764 A1 | 8/2011 |
| EP | 1938159 B1 | 8/2016 |
| EP | 2340592 B1 | 11/2019 |

OTHER PUBLICATIONS

Chen Yang Technologies; Split core hall effect dc current sensor CYHCT-C2TC; 4 pages; retrieved from the internet Jan. 5, 2015 (http://www.hallsensors.de/CYHCT-C2TC.pdf) (Product Information).

Pierce et al.; U.S. Appl. No. 16/653,583 entitled "Power line sensors with automatic phase indetification," filed Oct. 15, 2019.

Rumrill; U.S. Appl. No. 16/574,465 entitled "Systems and methods to measure primary voltage using capacitive coupled test point and grounded sensor circuit," filed Sep. 18, 2019.

Rumrill; U.S. Appl. No. 16/574,486 entitled "Distrubance detecting current sensor," filed Sep. 18, 2019.

Rumrill; U.S. Appl. No. 16/575,220 entitled "Systems and methods to maximize power from multiple power line energy harvesting devices," filed Sep. 18, 2019.

Saha et al.; Fault Location on Power Networks (Power Systems); Springer Verlag; London, UK; 435 pgs.; 2010 (Preface: Oct. 2009).

Shepard et al.; An overview of rogowski coil current sensing technology; 13 pages; retrieved from the internet Jan. 5, 2016 (http://www.dynamp.net/ldadocum.nsf/c2270fbdd892ac3e86256e75000ad88a/e710-af6d3e0f6255862565d7004b19db/$FILE/Report.pdf).

Stringfield et al.; Fault location methods for overhead lines; in Transactions of the American Institute of Electrical Engineers; Amer. Inst. of Electrical Eng.; New York, NY; Part III; vol. 76; pp. 518-530; Aug. 1957.

* cited by examiner

OVERHEAD POWER LINE SENSOR

CROSS REFERENCE TO RELATED APPLICATIONS

This application claims priority to U.S. application Ser. No. 15/818,512, filed Nov. 20, 2017, now U.S. Pat. No. 10,634,733, which in turn claims priority to U.S. provisional patent application Ser. No. 62/424,271, filed Nov. 18, 2016, both of which are incorporated herein by reference in their entirety.

INCORPORATION BY REFERENCE

All publications and patent applications mentioned in this specification are herein incorporated by reference to the same extent as if each individual publication or patent application was specifically and individually indicated to be incorporated by reference.

FIELD

The present disclosure generally relates to power distribution networks. More specifically, the present disclosure relates to integrated electronic devices used to monitor and detect abnormalities within a power distribution network.

BACKGROUND

In providing power to customers, electrical power utility companies employ a power grid distribution network that includes distribution-line-conductors (which are often referred to as power lines). Typically, difficulties or faults within the distribution network are identified only after occurrences of "events." These events may merely result in a temporary loss of power for a limited number of customers, but more significant problems may occur.

Power utility companies typically employ line sensors to monitor faults on power lines. Such faults may be temporary or permanent (e.g., a blown fuse). In its usual application, the line sensor will appear passive during the normal operation of the power lines, and will activate when triggered by an overcurrent exceeding a programmed threshold.

A limited number of line sensors may include rechargeable cells harvesting solar energy and/or the electromagnetic field of the conductor to extend operational and communications availability. Harvesting energy from the electromagnetic field in the proximity of the conductor can be engineered with magnetic cores around the conductor, capturing the magnetic field created by line current flow and transforming it to an AC voltage. Split-core toroidal transformers can be mounted around a conductor, eliminating the need to cut and splice the conductors.

However, current line sensors suffer from two major shortcomings: the inability to measure phase voltage on the power line and the inability to operate continuously with zero line current.

SUMMARY OF THE DISCLOSURE

A power line monitoring system is provided, comprising a first voltage divider element configured to be attached to a first conductor, a second voltage divider element configured to be attached to a second conductor, a coiled wire connected to the first voltage divider element and the second voltage divider element, the coiled wire configured to adjust a distance between the first voltage divider element and the second voltage divider element, and a processor electrically coupled to the first voltage divider element and the second voltage divider element, the processor being configured to monitor a voltage of the first and second conductors.

It is contemplated that the first voltage divider element is attached to the first conductor with a first clamp, and the second voltage divider element is attached to the second conductor with a second clamp.

The system can further include a silicon overmold configured to protect the power line monitoring system from moisture.

The processor can be configured to continuously sample current through the first wire to calculate a phase-to-phase voltage.

In some examples, the system includes power harvesting electronics configured to harvest energy from the first or second conductor to provide power to the power line monitoring system.

The first and second voltage divider elements can comprise a mix of resistive and capacitive voltage divider elements. As described herein, resistive voltage divider elements can be used by the processor to monitor the voltage, and capacitive voltage divider elements can be configured to provide power to the power line monitoring system.

A power line monitoring system is also provided, comprising a first voltage divider element configured to be attached to a first conductor, a first rigid element connected to the first voltage divider element, a second voltage divider element configured to be attached to a second conductor, a second rigid element connected to the second voltage divider element, a rigid extension element slidably disposed over the first and second rigid elements and configured to adjust a distance between the first voltage divider element and the second voltage divider element, a first wire connected to the first voltage divider element and the second voltage divider element and disposed within the first rigid element, the second rigid element, and the rigid extension element, and a processor electrically coupled to the first voltage divider element and the second voltage divider element, the processor being configured to monitor a voltage of the first and second conductors.

In one example of the system, the first rigid element, the second rigid element, and the rigid extension element comprise hollow tubes. The rigid extension element can have an internal diameter larger than an external diameter of the first and second rigid elements.

As described herein, the first voltage divider element can be attached to the first conductor with a first clamp, and the second voltage divider element can be attached to the second conductor with a second clamp.

The system can further include a silicon overmold configured to protect the power line monitoring system from moisture.

The system can also include water drain holes disposed in the rigid extension element.

The processor can be configured to continuously sample current through the first wire to calculate a phase-to-phase voltage.

The system can further include power harvesting electronics configured to harvest energy from the first or second conductor to provide power to the power line monitoring system.

In some examples, the system further comprises a third voltage divider element configured to be attached to the first conductor and the first rigid element, a fourth voltage divider element configured to be attached to the second conductor and the second rigid element, a second wire connected to the third voltage divider element and the fourth voltage divider element and disposed within the first rigid element, the second rigid element, and the rigid extension element. The first and second voltage divider elements can comprise resistive voltage divider elements, and the third and fourth voltage divider elements can comprise capacitive voltage divider elements. In some examples, the first and second voltage divider elements comprise a mix of resistive and capacitive voltage divider elements.

In one implementation, the resistive voltage divider elements are used by the processor to monitor the voltage, and wherein the capacitive voltage divider elements are configured to provide power to the power line monitoring system.

A power line monitoring system is also provided, comprising a first voltage divider assembly configured to span between a first conductor and a second conductor, a second voltage divider assembly configured to span between the second conductor and a third conductor, first electronics disposed on the first conductor, second electronics disposed on the second conductor, third electronics disposed on the third conductor, and a wire disposed in the first and second voltage divider assemblies and connecting the first, second, and third electronics, wherein the first, second, and third electronics are configured to simultaneously monitor a voltage and a current on each of the first, second, and third conductors.

The first and third electronics each can comprise a current sensor, an analog to digital converter, and a processor configured to transmit sensed data to the second electronics. The second electronics can comprise a current sensor, analog to digital converter, at least one voltage sensor, and a processor configured to receive sensed data from the first and third electronics.

The system can further include a fiber optic cable disposed in the first and second voltage divider assemblies and connecting the first, second, and third electronics, the fiber optic cable being configured to transmit digitized sensor data from the first and third electronics to the second electronics.

A power line monitoring device is further provided, comprising a first conductive shell configured to substantially encircle a first conductor, a first divider equipotential surface adjacent to the first conductive shell, a second divider equipotential surface adjacent to the first divider equipotential surface, the first and second divider equipotential surfaces configured to maintain incumbent radial equipotential surfaces of the first conductor, a second conductive shell configured to substantially encircle a second conductor, a third divider equipotential surface adjacent to the second conductive shell, a fourth divider equipotential surface adjacent to the third divider equipotential surface, the third and fourth divider equipotential surfaces configured to maintain incumbent radial equipotential surfaces of the second conductor, a wire connecting the first conductive shell to the second conductive shell, and a processor configured to monitor a voltage of the first and second conductors.

The first, second, third, and fourth divider equipotential surfaces can be semicircular in shape.

The system can further include a first rigid element connected to the first conductive shell, a second rigid element connected to the second conductive shell, and a rigid extension element slidably disposed over the first and second rigid elements so as to adjust a distance between the first conductor and the second conductor, wherein the wire is disposed within the first and second rigid elements and the rigid extension element.

The first rigid element, the second rigid element, and the rigid extension element can comprise hollow tubes. In one example, the rigid extension element has an internal diameter larger than an external diameter of the first and second rigid elements.

The device can further include a silicon overmold configured to protect the power line monitoring device from moisture.

The device can further include water drain holes disposed in the rigid extension element.

The processor can be configured to continuously sample current through the device to calculate a phase-to-phase voltage.

The system can further comprise power harvesting electronics configured to harvest energy from the first or second conductor to provide power to the power line monitoring device.

In some examples, the first conductive shell is configured to place the first and second equipotential surfaces at known distances to the first conductor. The second conductive shell can be configured to place the third and fourth equipotential surfaces at known distances to the second conductor. The first and second conductive shells are configured to allow for accurate control of the first, second, third, and fourth equipotential surface locations without regard to a diameter of the first or second conductors.

A power line monitoring system is provided, comprising a voltage divider adapted to be connected to a first conductor and a second conductor, the voltage divider including a variable length electrical connection configured to adjust a distance between the first conductor and the second conductor, the voltage divider comprising a secondary winding, and a processor electrically coupled to the voltage divider, the processor being configured to monitor a voltage of the first and second conductors, wherein the voltage divider is configured to provide power harvesting for the power line monitoring system from the first and second conductors while maintaining a constant voltage on the secondary winding with a varying secondary load current on the secondary winding.

The system can further include power factor correction circuitry configured to appear as a resistive load on an AC source. In one example, the system further comprises a secondary processor on a DC output of the power factor correction circuitry configured to maintain a constant current draw on a fixed DC source.

DETAILED DESCRIPTION

Figure 1A:
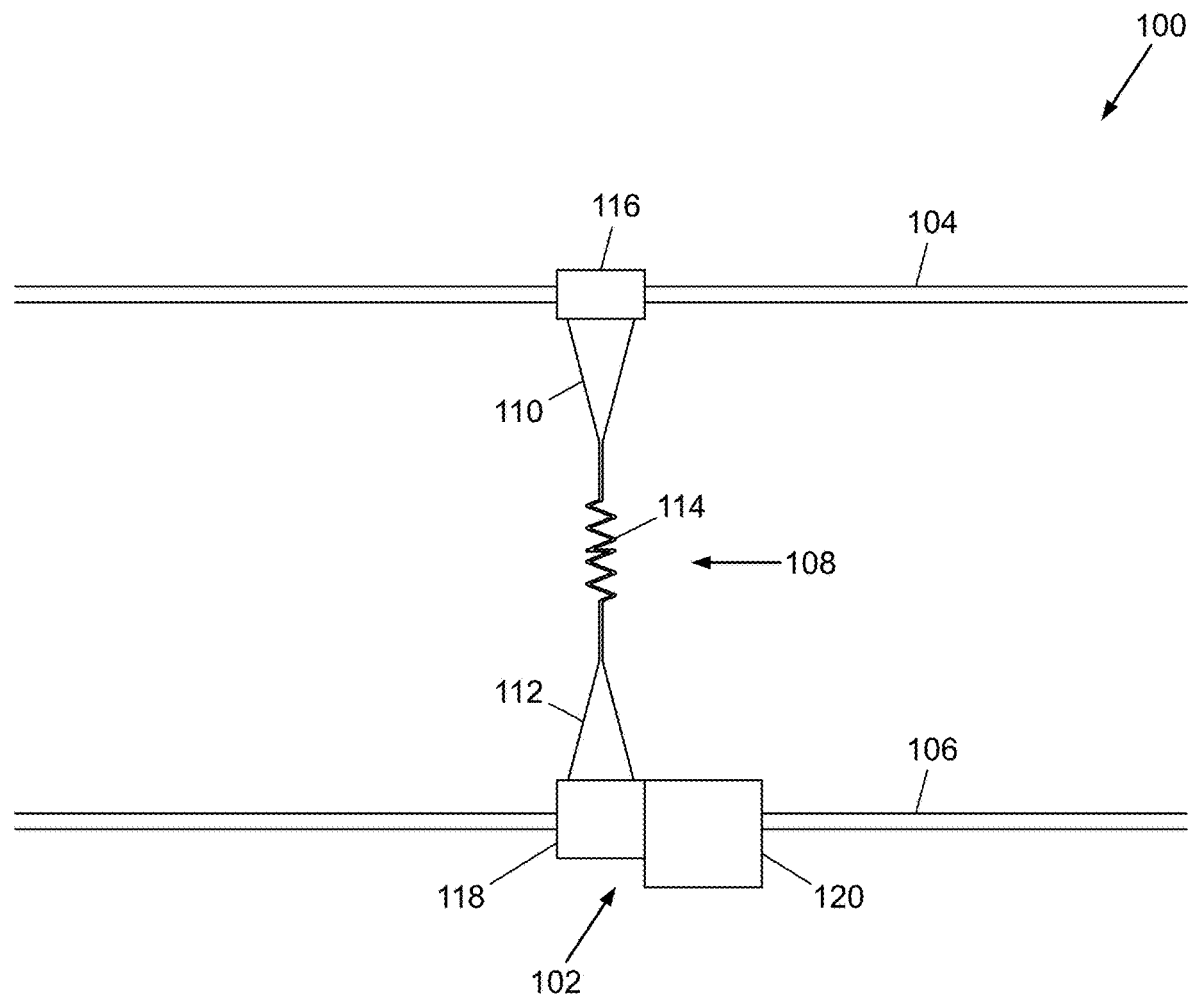
FIGS. 1A-1D illustrate embodiments of a power line monitoring system.

Power line monitoring devices and systems described herein are configured to measure the currents and voltages of power grid distribution networks. Referring to FIG. 1A, monitoring system 100 comprises monitoring device 102 mounted across adjacent power line conductors 104 and 106 of a power distribution network. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 69 kV) to reduce the energy lost during transmission over long distances. The monitoring devices can also be used on high voltage "transmission lines" or conductors that operate at voltages higher than 69 kV.

The monitoring device 102 can be configured to monitor, among other things, phase voltage, conductor current, phase-to-phase voltage, conductor temperatures, ambient temperatures, vibration, wind speed and monitoring device system diagnostics. The monitoring devices can measure current in peak amplitude or root-mean-square (RMS) values and waveforms with, for example, Rogowski coils, Hall-effect sensors, current transformers, or other similar current measurement devices. Phase, and phase-to-phase voltage can be similarly measured using the below described voltage divider network. Phase voltage can be measured in 4 wire systems with a neutral conductor.

The monitoring device can be mounted quickly and easily via a hot-stick, and can harvest energy from the power lines for operation or be self-powered (e.g., include batteries or solar panels). The monitoring devices can further include wireless transmission and receiving capabilities for communication with a central server and for communications between each monitoring device. Installation of the monitoring device is simple, allowing the device to be placed and configured by a single linesman with a hot-stick and a bucket truck in less than 20 minutes. Monitoring device communication with the installation crew can be enabled during the installation process to provide immediate verification of successful installation.

Referring still to FIG. 1A, the monitoring device 102 utilizes a voltage divider 108 positioned across adjacent power line conductors 104 and 106. The voltage divider 108 can include one or more voltage divider elements 110 and 112 connected by a wire 114, which can be a single wire, or a plurality of wires. In the simplest implementation, as shown in FIG. 1A, the voltage divider includes a single voltage divider. In other implementations, a second voltage divider may be used to provide higher accuracy and/or higher available sensor system power as explained below. The wire 114 can be straight, curved, or shaped as a spring, as shown in FIG. 1A. The voltage divider 108 can be attached to the adjacent power line conductors with a pair of clamps 116 and 118, as shown.

The monitoring device 102 further includes an electronics box 120, which can house the remaining electrical components of the monitoring device. For example, a current sensor, data acquisition circuitry, a power transformer, and a WAN radio, among other features, can be contained within the electronics box 120. The power transformer can be used to provide power for the operation of the monitoring device. Physically, the electronics box could be designed as an integral part of the clamp and voltage divider, or it could be a separate assembly connected by the required wire(s). An integral assembly design has the advantage of being a simpler and possibly a more reliable design by eliminating any exposed electrical connections. The mechanical design of the conductive components in an integral assembly would be advantageously directed by 3D electromagnetic field simulation software for the purpose of maintaining the desired E-field distribution as explained below. A separate assembly design has the advantage of decoupling the high voltage design requirements of the electronics box from those of the divider components. This could potentially provide the highest performance solution. Another potential advantage is that it would allow orientation of the electronics box advantageously on the conductor to which it is mounted. Note that the device will be mounted phase-to-phase on conductor systems which can be in any arrangement, for example, horizontal, vertical, triangular, etc. Certain functions within the electronics box may benefit from a known physical orientation, for example, radio antennas or vibration sensors.

Figure 1B:
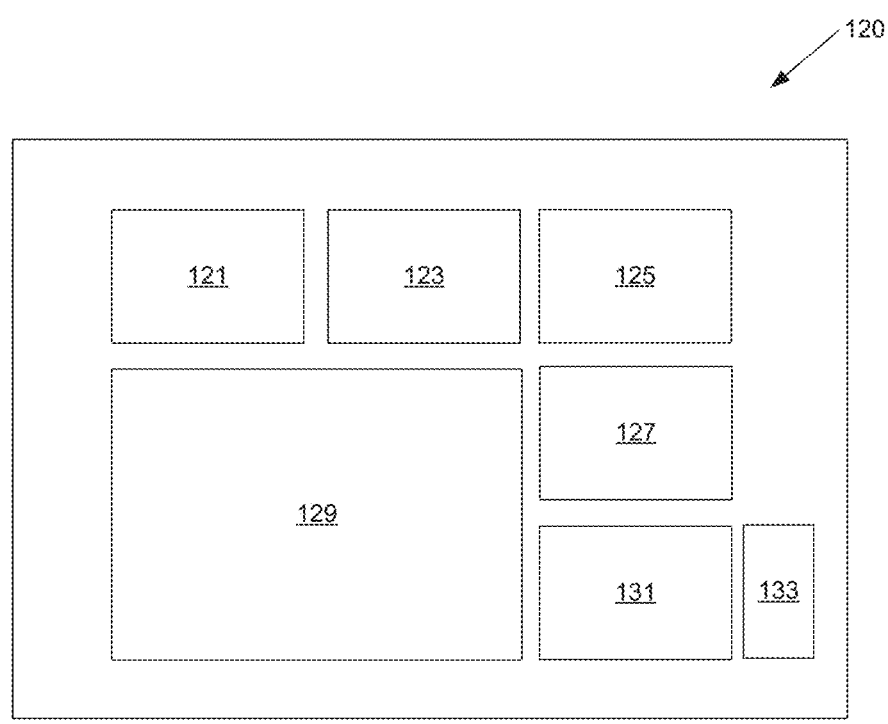

Referring to FIG. 1B, the electronics box can comprise sensing elements 121, a power supply 123, battery 125, energy harvesting components 127 including a power transformer, a microprocessor board and CPU 129, high powered communication systems 131, including transmit and receive capabilities, and GPS receiver 133, disposed within a robust mechanical housing designed for severe service conditions.

The monitoring device 102 can be configured to calculate power parameters related to 3-phase operation, power delivery and fault conditions. Because the monitoring device 102 can, in some embodiments, have the data from all three phases, and the data or waveforms are synchronized, calculations for 3-phase vector diagrams and 3-phase power quality can be made.

In the illustrated monitoring device of FIG. 1A, power to operate the sensor electronics functions can be obtained from current flowing in the voltage divider 108. A power transformer within the energy harvesting components of the electronics box can be used to convert a high voltage/low current primary winding in series with the divider to a lower voltage/higher current secondary output compatible with common power supply electronic components. This power is available as long as there is voltage present on the two attached conductors; distribution network load current in the conductors is not necessary for operation of the monitoring device.

As previously mentioned, a spring design could be implemented in the voltage divider to allow for the varying distances between conductors. The spring could be a very stiff, single turn spring, with the single turn start-to-finish length of, for example, a foot or more. The spring itself could provide the electrical connection "wire" for the voltage divider, and/or additional wires could be wrapped with the spring. The full range of possible conductor movement would need to be accommodated to prevent mechanical failure. The possible range of conductor movement could be constrained by requiring installation reasonably close to a pole.

For each installation location, there will be an ideal length (the distance from clamp 116 to clamp 118 in FIG. 1A) for the voltage divider. For each system voltage class, the size of the voltage divider elements 110 and 112 in FIG. 1A will be fixed as further described below. As previously mentioned, the wire 114 can be a fixed length rigid wire, or can take the form of a spring that could provide both a fixed tensile load along the voltage divider and a range of lengths with little tensile load variation. If a spring is used, it could be damped to prevent mechanical oscillation. Because the resistance of the wire 114 is not important, it can be any metal (e.g., bronze, stainless steel, etc.) and an in some embodiments, would not necessarily need to be insulated.

Figure 1C:
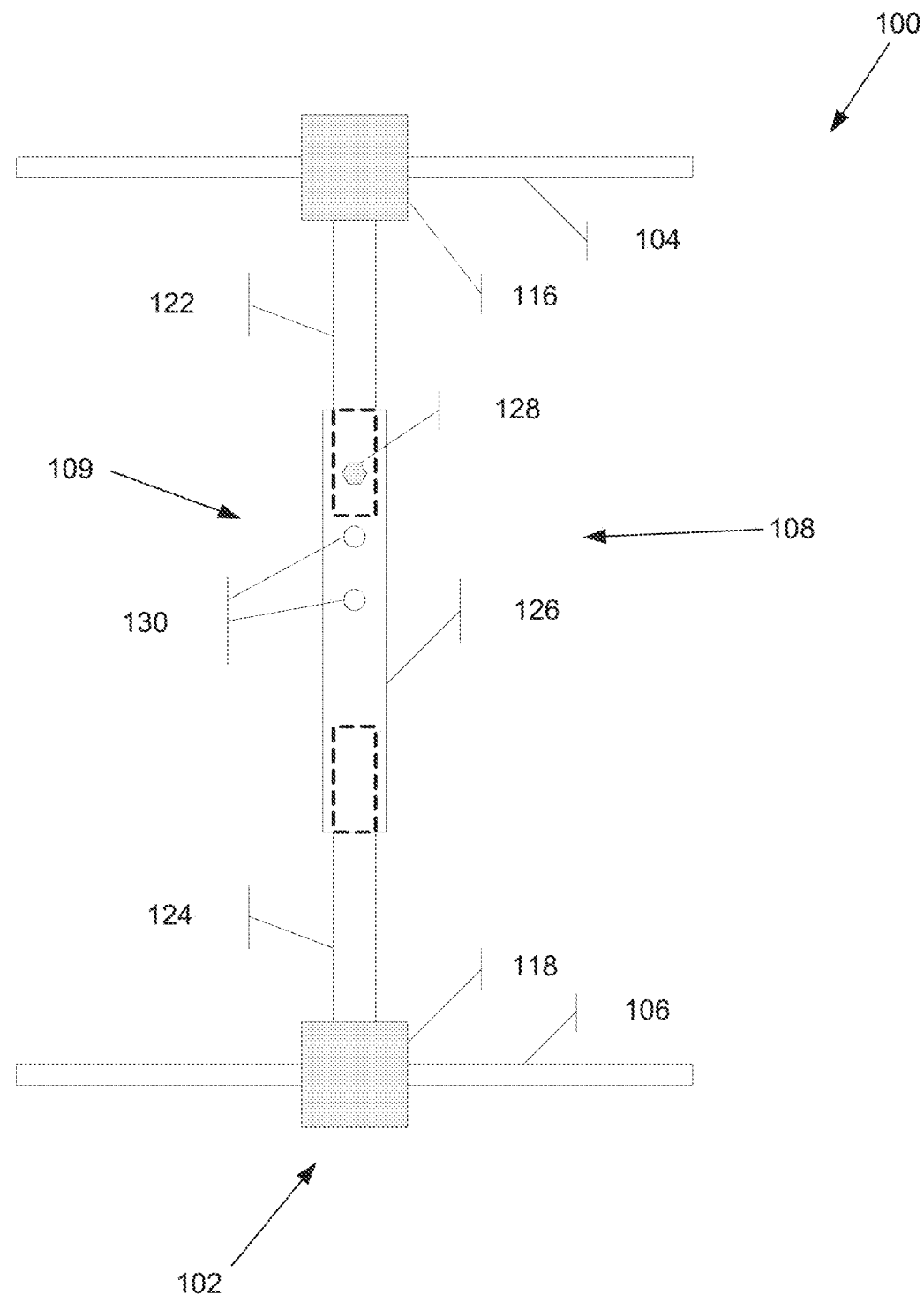

FIG. 1C illustrates another embodiment in which the voltage divider 108 is implemented in a rigid bar design that spans across the adjacent conductors. Referring to FIG. 1C, the monitoring device 102 comprises a voltage divider 108 incorporating a rigid hollow core tube assembly 109 that includes tube elements 122 and 124 and extension tube 126. The extension tube can have a larger internal diameter than the external diameter of the tube elements 122 and 124 so as to slide over the tube elements. The length of the rigid hollow core tube assembly 109 can be adjusted by placing bolts 128 into the desired bolt holes 130, depending on the distance between adjacent conductors 104 and 106. The voltage divider 108, which includes the rigid hollow core tube assembly 109 and clamps 116 and 118 in FIG. 1C, can be configured to prevent undesirable physical movement of the conductors caused by, for example, wind or a high current fault. In this embodiment, the device could additionally be used to provide the functionality of an existing, commonly used device, the "interphase spacer" or IPS. In this embodiment, the clamps 116 and 118 can further include housings to house the voltage divider elements and electronic components described above in FIG. 1A.

The system is designed to operate over the full spectrum of outdoor environmental conditions. The voltage divider (e.g., comprising resistive and/or capacitive elements and the required electrical connections) and the rigid hollow tube can be protected from moisture. In one embodiment, for example, the device can be protected with a silicone overmold. The bolt and hole design shown in FIG. 1C requires a through clearance hole for the bolt in the tube element 122 and the extension tube 126. The divider network electrical connection may pass through the inside of the tubes and would need to be protected from the bolt during installation. For highly polluted environments, a design that swages the extension tube 126 to the tube element 122, possibly with an additional silicone seal, may be required. This embodiment would not require the bolts 128 and holes 130. If an environmental seal between the extension tube and the tube elements cannot be maintained, water drain holes can be placed in the extension tube.

As described above in FIGS. 1A and 1C, a single voltage divider can be used in the simplest implementation of the voltage divider 108. In this embodiment, the voltage across and the current through the device power transformer is continuously sampled and, using the known remaining divider impedance, the phase-to-phase voltage is calculated.

The phase voltage measurement accuracy of a single voltage divider device design will be dependent on the accuracy of the voltage divider impedance model. Impedance models that include significant reactance (capacitance primarily) will require one or more complex number multiplications at each sample time to determine phase voltage. This is of course possible, but to implement a continuously reporting voltage measurement system, this would have to occur in real time. This may most realistically be implemented in hardware, for example, a FPGA. This adds a significant level of complexity and it is anticipated that it would only be used where the use of a single electrical connection through the divider network was highly desirable.

Figure 1D:
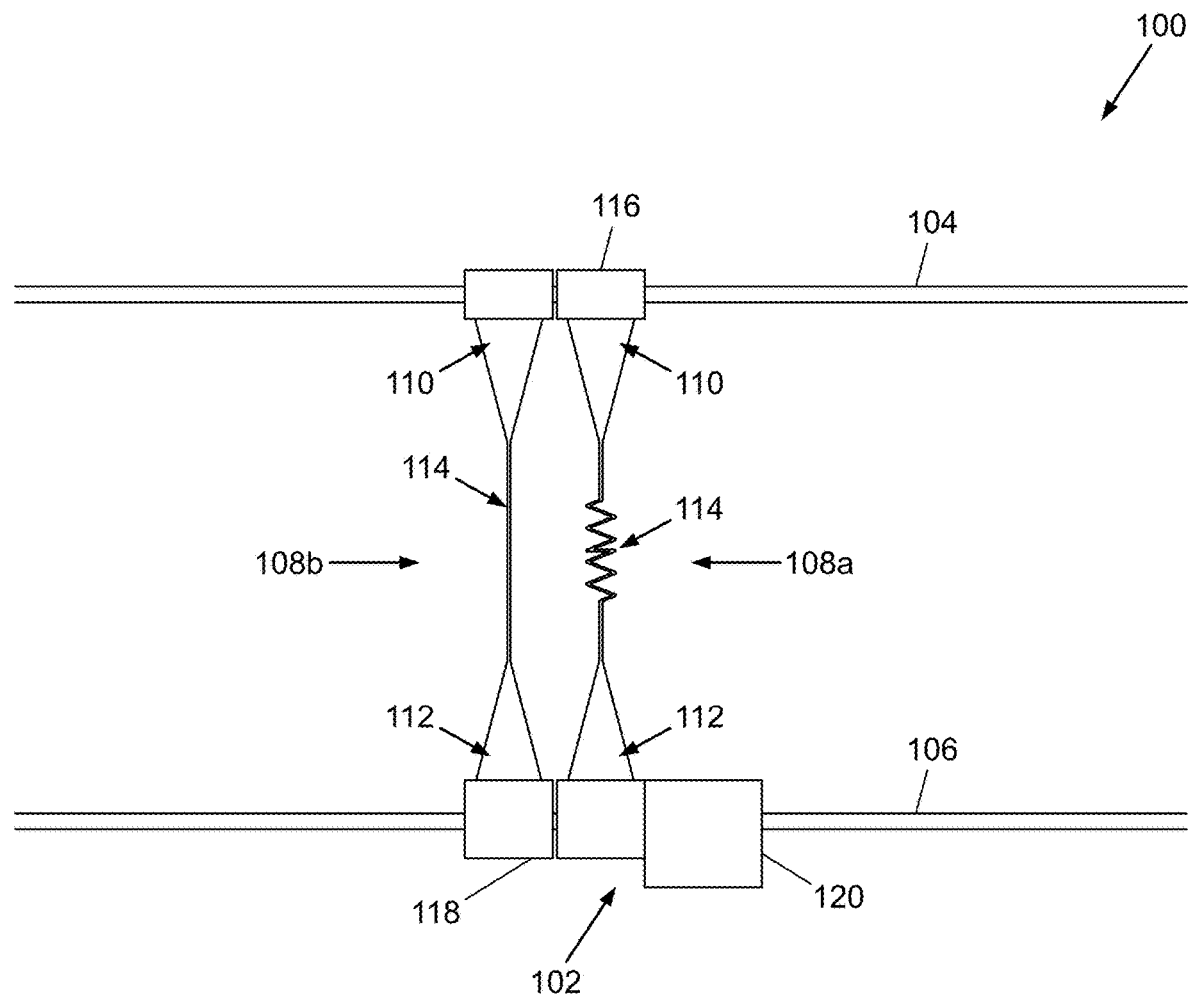

In another embodiment shown in FIG. 1D, the monitoring device 102 utilizes two voltage dividers 108a and 108b. Both of the voltage dividers include voltage divider elements 110 and 112 and wires 114, as described above. As shown in FIG. 1D, the voltage divider 108a is shown with a coil or spring wire 114, while voltage divider 108b is shown with a straight wire 114. This is purely for illustrative purposes, to show that either design could be used. Furthermore, the embodiment of FIG. 1D can implement the hollow core tube design of FIG. 1C. In one example, both of the voltage dividers could share a single hollow core tube design. In another embodiment, each voltage divider could have its own separate hollow core tube design between the conductors. Typically the same wire design would be used for both voltage dividers. In one embodiment, the highest accuracy and bandwidth version of the dual voltage divider monitoring device uses a dedicated resistive and/or resistive/capacitive divider for voltage measurement and a second divider, such as a capacitive voltage divider, as the power source for the device. The capacitive divider can enable the highest continuous available system power as it minimizes heat in the divider as explained below. Using a separate voltage divider network for power harvesting and voltage measurement could also permit accurate voltage measurement during utility network transient events that would otherwise have to be clamped to protect the device power transformer in a single divider implementation.

Both resistive and capacitive voltage dividers can be implemented in the monitoring device, and have benefits and drawbacks. A capacitive divider cannot obtain the voltage measurement accuracy possible in a resistive divider design. It has the advantage however of being able to support large voltage drops with little real power loss. Therefore, a capacitive divider would be the divider of choice to provide the maximum available continuous system power. In the resistive divider, voltage drops across the resistive components create real power loss and therefore heat. In the single-circuit divider previously discussed (the "one wire" embodiment in FIG. 1A) this power loss will set the limit for the continuous system power available.

FIG. 1A shows two conductors 104 and 106 and could comprise the complete hardware requirement for a single phase circuit. Three phase circuits could be supported by various divider/electronics box configurations, as will be described in more detail below. To obtain phase current and other conductor specific measurements (e.g., conductor temperature), active electronics must be present at the conductor attachment location.

Continuous system operation with several watts available will permit new data acquisition and signal processing opportunities. For example, phase voltage and current could be sampled at any desired bandwidth in a continuous fashion, similar to current oscilloscope architectures, and an anomalous-event trigger algorithm could forward both current and voltage waveforms with pre-trigger data as well as post-trigger data.

To safely enable an electrical connection between two phases of a power grid, the existing phase-to-phase insulation system must not be significantly compromised. This is supported in the voltage divider 108 by: 1) controlling the voltage gradient through the divider and 2) providing a divider circuit insulation system.

A key feature of the device design will be its ability to maintain the performance of the incumbent conductor-to-conductor insulation system to the extent possible. For overhead lines, the insulation medium is air. Because the device includes a phase-to-phase electrical connection, the E-field will be disturbed by the presence of the conductive elements. To minimize the E-field disturbance, the device can be designed with graded impedances between conductive elements along the length of the divider as described further below. The potential for flashover under these circumstances will not be controlled by divider network conductance, but by the surface conductivity of the silicone overmold used. This means the device's potential for flashover will be set by the silicone overmold creep distance, hydrophobicity, and level of surface pollution contamination, in other words, its potential for flashover will be the same as that for an equivalently designed IPS without an electrical connection. This infers that the design of the device silicone overmold insulation system can follow that of existing field-proven IPS designs.

It is generally understood that the E-field gradient is greatest immediately adjacent to the energized conductor and falls off very rapidly (approximate natural log function of distance) as the radial distance from the conductor is increased. In order to allow installation of the device in the widest range of conductor-to-conductor spacings, it is desirable to minimize the length of the divider elements 110 and 112 in FIG. 1A. The shortest desirable divider element length is one designed to match the incumbent E-field gradients to the extent possible. The "incumbent E-field" is the E-field that would be present without a device installed. A shorter divider element length will necessarily create higher E-field gradients through the divider element length, requiring an enhanced insulation system design for the device. As the divider element length is increased, E-field gradients through the entire length of the voltage divider 108 can be made less. The wire 114 between the two divider elements 110 and 112 has a constant voltage throughout its length, necessarily disturbing the surrounding E-field, and would create the largest incumbent E-field disturbance at the wire attachment points to the divider elements regardless of the divider element length used.

Equipotential surfaces can be used for all of the conductive components of the voltage divider element to the extent possible, again to minimize incumbent E-field disturbance. Minimizing E-field disturbance is particularly important for maximizing transient voltage (e.g., lightning impulse) survival performance. If the air between two conductors can support the transient voltage without breakdown, then a divider system that does not create E-field gradients in excess of the incumbent E field will also support the transient voltage as the divider insulator material has a higher dielectric strength than air. Note that breakdown can still occur due to insulator surface contamination. Dividers that incorporate capacitive components require additional consideration to ensure transient survival as discussed further below.

Figure 2A:
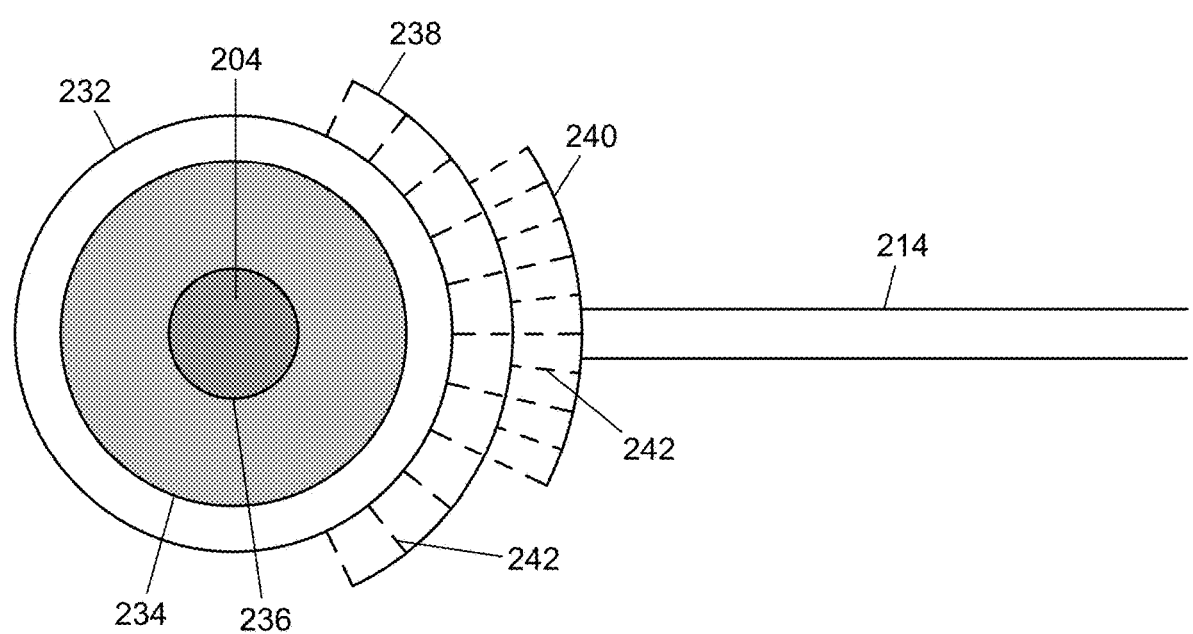
FIGS. 2A-2C show a divider conductor shell that allows control of equipotential surface locations in the critical area immediately adjacent to the conductor without regard to the conductor diameter.
Figure 2B:
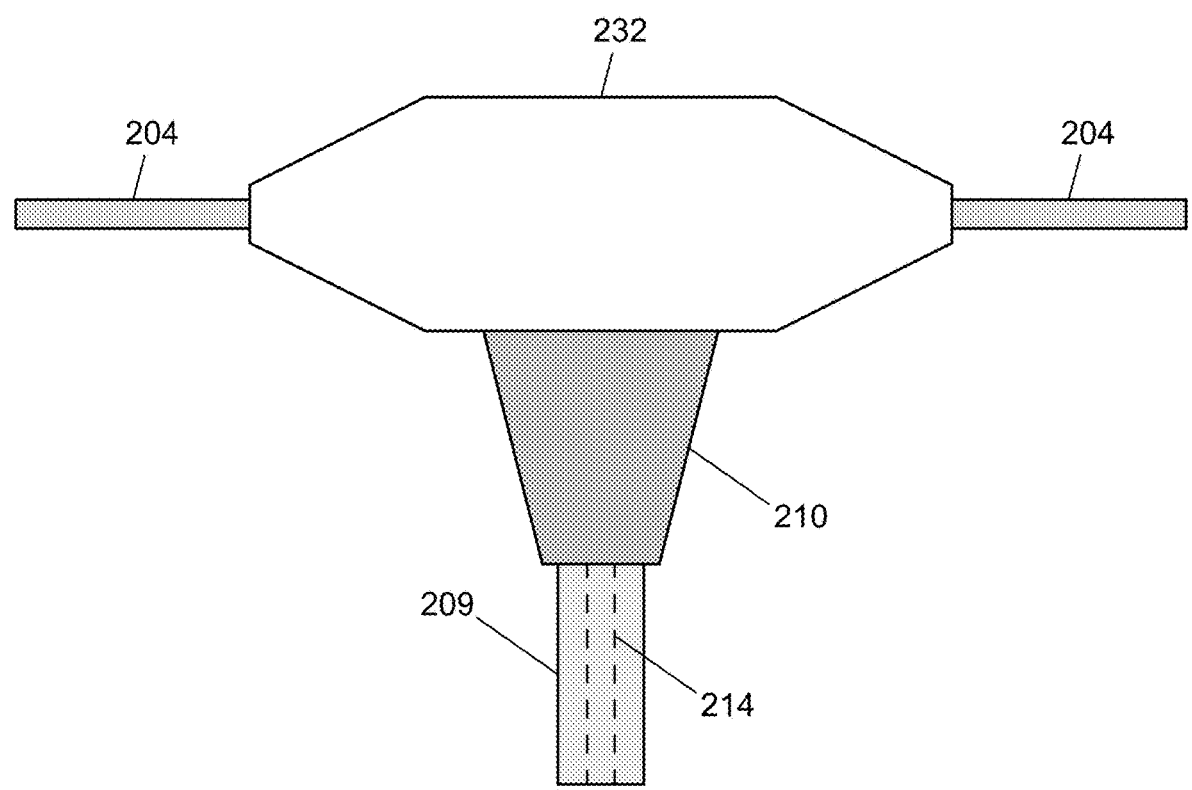
Figure 2C:
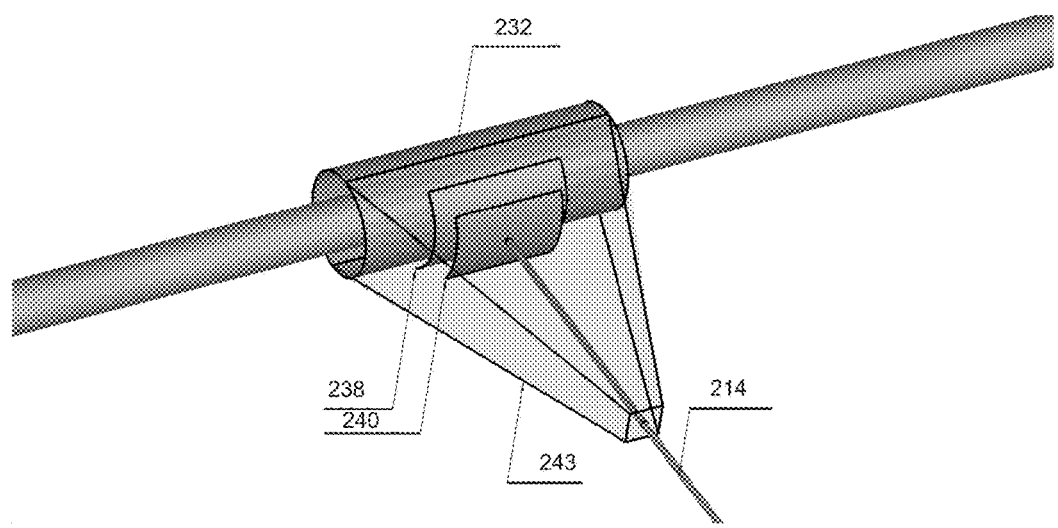

It is also understood that the E-field gradient in the vicinity of the conductor increases as the diameter of the conductor decreases. For this reason, the device design includes a feature that creates a known equivalent "conductor diameter", as shown in FIGS. 2A-2C. This design allows control of the equipotential surface locations in the critical area immediately adjacent to the conductor without regard to the conductor diameter. This is key to controlling the accuracy of the equipotential surface voltages in close proximity to the conductor.

To minimize the current necessary through the divider for power harvesting purposes, thereby limiting the power dissipated in any series resistances and limiting the value of capacitances necessary, the largest possible voltage would be used across the power transformer primary winding. To minimize the size, weight and cost of the power transformer, this voltage would be advantageously limited to values that standard magnet wire can support. A value of 1 kV is used as an example realistic value.

For power harvesting purposes, it is desired that the impedance between the first divider equipotential surface and the system local "ground" which is the conductor potential, be maximized. The physical distance between the divider conductor shell and the first divider equipotential surface could be quite small if it is desired to maintain a, for example, 1 kV potential difference between the two elements. The goal in this case would be to minimize both the area and the dielectric constant of the connecting elements as the impedance of concern will be primarily capacitive. Physically small conductive elements are generally undesirable for electric discharge performance, for example, corona. A physically small component, for example, a wire, in close proximity to the conductor with approximately 1 kV of potential between it and the conductor is not expected to be troublesome. The primary challenge will be the area surrounding the wire connection to the divider network, this can be optimized using the aforementioned 3D EM simulation software.

For voltage measurement purposes, the opposite of the above described case may be advantageous. A low source impedance for the voltage measurement divider tap may simplify or lower the cost of the associated measurement electronics. The connecting "wire" in this case may advantageously be a flat foil or flat braided wire mounted in close proximity to the conductor to minimize electromagnetic noise coupling to the connection. This wire structure could also provide lower E-field gradients surrounding the wire, thereby minimizing corona discharge noise coupled to the input.

FIGS. 2A-2C illustrate a divider conductor shell 232 that comprises a conductive cylindrical object that fully encircles the minimum and maximum conductor shells 236 and 234, respectively, of a conductor 204, as shown. FIG. 2A is a cross-sectional view, FIG. 2B is a top view, and FIG. 2C is a 3D perspective view. A divider conductor shell can be placed on each of the conductors as shown in FIG. 1C. Therefore, each monitoring device that spans between two conductors can include two divider conductor shells connected by a wire 214. The wire can be surrounded by a rigid hollow tube 209 as described above. The divider conductor shell 232 can comprise a clam shell design that can be opened and then closed over the conductor upon installation, or it can be a semicircular shape with an opening large enough to allow the maximum diameter conductor to pass through. The conductive shells allow for accurate control of the equipotential surface locations without regard to a diameter of the conductors, which can vary depending on the application.

In FIGS. 2A and 2C, two "equipotential surfaces" are shown, a first divider equipotential surface 238 and a second divider equipotential surface 240. These divider surfaces can be conductive objects whose potentials will be designed to match the system incumbent equipotential surfaces as previously mentioned. The divider surfaces are shown collectively as a divider element 210 in FIG. 2B. The resistive or capacitive element 242 shown is the impedance that provides the appropriate voltage drop through the divider. Only two equipotential surfaces are shown, most designs will likely use a larger number of these. FIG. 2C further shows an insulator 243 that encapsulates the equipotential surfaces and a portion of the wire 214. The insulator protects the high impedance divider network components from the weather and supports any increased E-field gradients created by the conductive elements of the voltage divider. In some embodiments, the insulator can be silicon.

The resistive or capacitive element 242 in FIG. 2A can be a solid material with a given resistivity to form a resistive element, or could be a dielectric material to form a capacitive element. Alternatively, the desired impedance could be had by using discrete resistor or capacitor components. While one discrete component could be used, it would likely be advantageous to use a number of components distributed through the available area, located, for example, at the dashed line locations shown in FIG. 2A. This, for example, would advantageously lower the inductance of the element for a wideband voltage measurement divider or would spread the area available for heat dissipation in a resistive section.

The divider equipotential surface objects in FIGS. 2A and 2C are shown as semicircular. While this is a likely desirable shape, the entire device, including the voltage divider details would be modeled in currently available 3D electromagnetic simulation software. This would enable a design that could be optimized for electromagnetic environment performance, voltage divider accuracy, etc.

The resistive or capacitive element 242 between the divider conductor shell 232 and the first divider equipotential surface 238 could be designed to support a large heat load. If the divider conductor shell 232 is designed to be a substantial metallic object and it is, for example, bolted to the conductor with a large contact surface between the two, the divider conductor shell 232 would be capable of conducting considerable heat away from the first impedance element in the divider. Because it is possible for utility conductors to operate at elevated temperatures, for example 100° C. or more for brief periods, the divider components (at least in the first divider section) would need to be able to operate at these elevated temperatures. Many resistive materials and discrete components could be utilized at these temperatures.

As shown in FIGS. 1A-1D, two divider network assemblies will be used at each conductor location. This provides the minimum disturbance to the incumbent E-field and is critical for safety reasons as described below. The center section of the device does not see any substantial E-field gradient and therefore can support a solid wire through its length without substantial detriment. This also means the extension tube 126 in FIG. 1C can be metallic without substantial detriment.

To obtain the minimum disturbance to the incumbent E-field and to maintain a fixed range for the power transformer primary winding voltage, a separate design would be used for each voltage class of service, for example, 15 kV, 25 kV, 36 kV, etc. For each voltage class of service, the actual service voltages that could be supported by the device would be specified. The voltage divider used for power harvesting would be designed to source a specific range of voltage on the first equipotential surface (and therefore the power transformer primary winding) with a known device load current, this requires different divider impedances for each voltage class. To supply a constant, known, device load current requires a fixed resistive load that dissipates a fixed power at the nominal power transformer secondary winding voltage. The circuitry to support this requirement is discussed further below.

A key design feature of the monitoring device is the manner of making the necessary electrical connections between the electronics box, the clamp, and the voltage divider. At a minimum, one electrical connection per voltage divider network circuit used will need to be made. This connection would tie to the first divider equipotential surface shown and described above in FIGS. 2A-2B.

It is anticipated that the device will be commonly installed on 3 phase delta systems or 3 phase systems without regard to the neutral conductor. Using the device as described to this point, three devices would be required, each with a single electronics box attached to the alternate phases to measure the desired individual conductor parameters. Sensor data for each phase would be transmitted wirelessly via radio back to the utility SCADA system. This data could include an accurate time stamp provided by a GPS receiver in the electronics box.

Alternatively, only two devices could be used, each device including two electronics boxes, one at each end. Only two of the three phase-to-phase voltages would be measured, the third phase-to-phase voltage could be calculated from the first two.

Some considerable benefit could be had if it would be possible for one electronics box at an installation site to have more-or-less real time phase voltage and current data from all three phases. The voltage and current data streams from the three phases would need to be time synchronous. This would permit local calculation of important system parameters, for example, power factor, which could be used, for example, to predict a pending utility system component failure or to indicate otherwise undetectable system disturbances and transmit them as a single event in near real time back the utility SCADA system. It is generally unrealistic to stream many channels of continuous data back to the SCADA system and process that data from, for example, tens of thousands of monitors simultaneously.

To enable such a system of devices, a high speed data connection would have to exist between the three sensor electronics boxes required. This could be implemented via, for example, a fiber optic connection that travels along with the divider network, a local radio connection, or an over-the-air optical connection (e.g., infrared). Time synchronization of the data streams could be via characterization of the known hardware propagation delays through the system or, for example, periodic correction of the data stream timing could be made using an accurate GPS time stamp that is periodically transmitted along with the data.

The described system can provide time synchronized system voltage and current values along with an accurate GPS-enabled real time stamp via a radio link back to a utility central processing facility. These are the key functions of another familiar utility measurement device, the PMU (phasor measurement unit).

Figure 3:
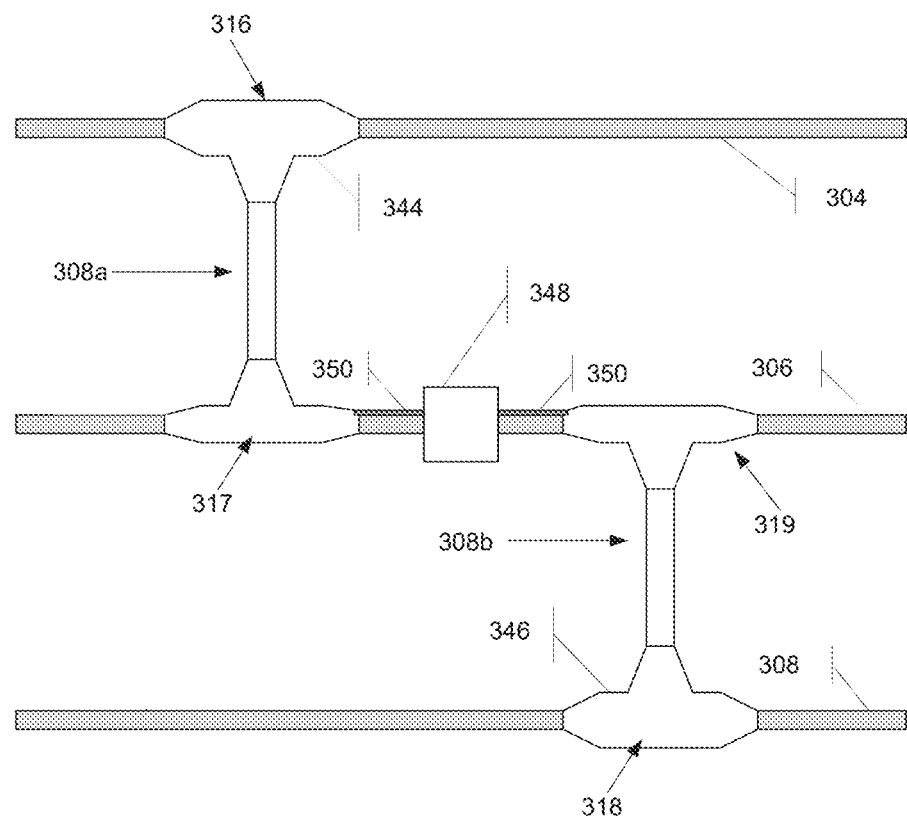
FIG. 3 shows power line monitors on a three-phase conductor.

FIG. 3 shows a configuration that uses three electronics boxes, first and second boxes 344 and 346 that are integrated into the clamps 316 and 318 that are attached to the two outer conductor phases, conductors 304 and 308, and a third, master electronics box 348, which is attached to the center phase conductor 306. Each of the electronics boxes can include all of the electronics described above for electronics box 120 of FIG. 1B. In some embodiments, additional electronics can be included for communication between each of the electronics boxes. Each of the two voltage dividers 308a and 308b are constructed similar to that described in FIG. 1C. In addition to the voltage divider network electrical connection(s), a fiber optic cable can pass through the center of the rigid hollow tubes. The fiber optic cable can be used to transmit voltage, current, etc. digitized sensor data, either multiplexed onto a single fiber, or through multiple fiber optic links from the clamp/divider/electronics boxes to the master electronics box. A cable 350 shown in FIG. 3 can connect clamps 317 and 319 to the master electronics box 348, including the voltage divider connection(s) and the fiber optic connections.

For ease of installation of the FIG. 3 embodiment, a single assembly could be used. The installer would first attach, by hot stick, the master electronics box 348 to the center conductor 306 with the two clamp/divider subassemblies 317 and 319 dangling freely from the box by the cable 350, fully tightening the associated clamp. The two clamp/divider assemblies would be installed next onto the center conductor, removing any significant slack in the cable and partially tightening the clamps. Clamp/divider assemblies 316 and 318 would then be installed on the outer conductors 304 and 308, allowing the cable 350 to rotate about the center conductor as necessary. As a final step, the clamps on the two center conductor clamp/divider assemblies 317 and 319 would be tightened.

It is desirable for a line monitoring device to be able to run continuously throughout its design lifetime which could be 10 or 20 years. It would be desirable for the device to continuously measure a number of parameters, including, for example, line current, phase voltage, conductor temperature, etc. In addition, the wireless data link in the device can require varying amounts of power depending on the technology used. For example, some radios will consume 2 or 3 watts or more during transmission. Some radio network technologies work best if the radio is continuously powered, for example many mesh networks.

Modern measurement data acquisition electronics can provide excellent performance without considerable power requirements, however the present design enables the inclusion in the monitor device of new measurements and data acquisition technologies that were impractical with prior line monitor designs. For example, it could include voltage, current, vibration, etc. measurements that ran continuously and that were stored in a FIFO buffer. These data streams could be monitored to trigger a capture of data by a local CPU based on some utility network disturbance criteria for example. The device would be capable of returning both pre and post trigger measurement data to the utility SCADA system when local CPU detects a programmed disturbance event. Higher performance CPUs could be used, running at increased clock rates. Continuous signal processing on the measurement data streams, for example a RMS calculation or a FFT, could be performed in hardware, for example using a FPGA. The FPGA could be programmed through the radio link to update its capabilities. The device could include technologies that were previously impractical, for example, wideband sensors for partial discharge detection.

The above capabilities are estimated to require from 1 to perhaps 3 or 5 watts. It would therefore be desirable to include in the device a power harvesting design that could support this requirement. A transformer whose primary winding is in series with the voltage divider network could be used to provide the required power. For example, a transformer with 1000 volts across its primary winding and 1 ma of current flowing in the divider, would be capable of providing 1 watt of (lossless) power on a secondary winding. The secondary winding could be designed to source a convenient lower voltage that could utilize readily available DC power supply components. The transformer design could potentially utilize an autotransformer winding configuration rather than a separate secondary winding if that were advantageous, for example, for cost reasons.

Both resistive and capacitive voltage dividers have been proposed. It is anticipated that a purely capacitive divider cannot obtain the voltage measurement accuracy or the bandwidth possible in a resistive or combination resistive/capacitive divider design. It has the enormous advantage however of being able to support large voltage drops with little real power loss. This, therefore, would be the divider of choice to provide the maximum available continuous system power. In a resistive divider, voltage drops across the resistive components create real power loss and therefore heat. In a device design that utilizes a single divider circuit that includes resistive components, this power loss will set the limit for the continuous system power available.

Figure 4:
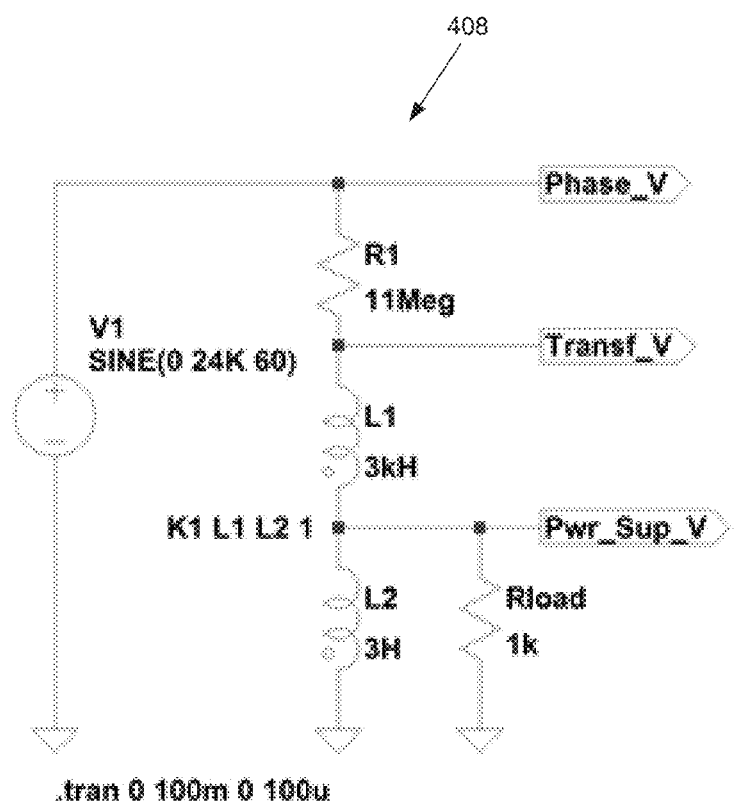
FIG. 4 illustrates one embodiment of a resistive voltage divider.
Figure 5:
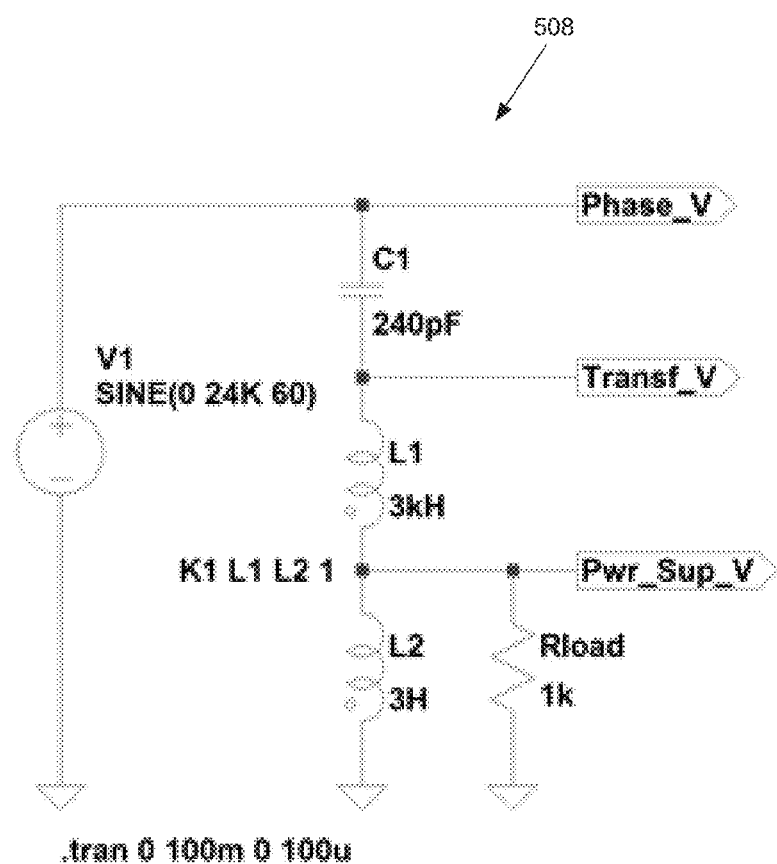
FIG. 5 shows one embodiment of a capacitive voltage divider.

FIG. 4 illustrates a resistive voltage divider 408, and FIG. 5 illustrates a capacitive voltage divider 508. The primary divider element is represented by R1 in FIG. 4 and C1 in FIG. 5. L1 and L2 comprise the power transformer in each of the designs. This can be a conventional two-winding transformer, or, potentially, an autotransformer. Rload represents the proposed real power load.

Figure 6:
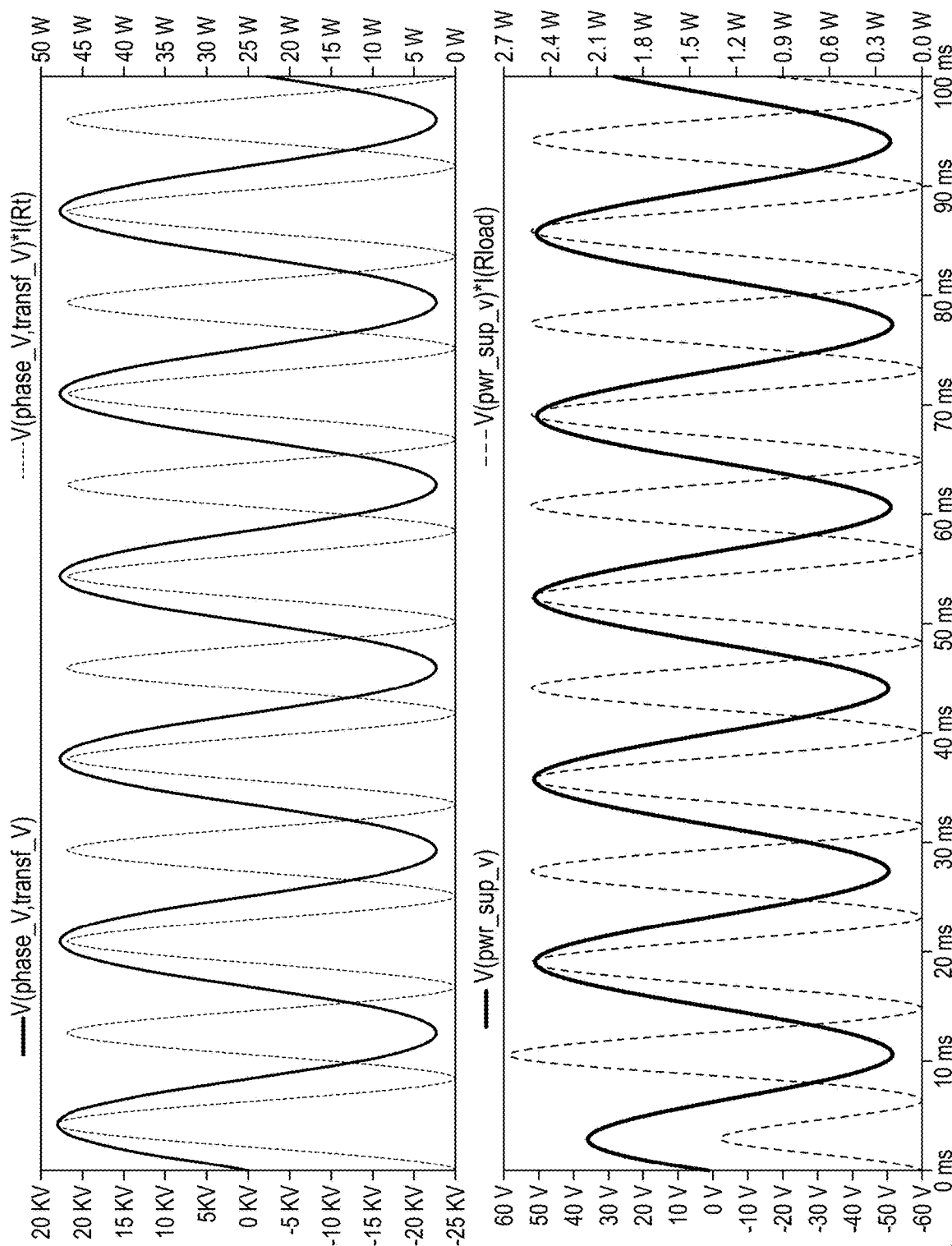
FIGS. 6-7 show simulated waveforms of the resistive and capacitive voltage dividers of FIGS. 4-5.

Sample simulated waveforms for the resistive divider of FIG. 4 are shown in FIG. 6. For this example, a 24 kV peak conductor voltage was used, resulting in a peak current through the resistive voltage divider of approximately 2 ma. As seen in FIG. 6, the peak power in R1 is about 47 Watts, the average (rms) power would be 23.5 Watts. This power would be shared in the two voltage divider components 110 and 112 shown in FIG. 1A. The voltage across the primary of the power transformer is approximately 1.1 kV rms. This value was chosen to represent an easily implemented transformer design. Higher primary voltages will yield higher available output powers with equal current through the divider, also decreasing the voltage necessary to drop across divider resistance. The secondary of the power transformer in this design sources approximately 50V peak, 35V rms, and provides approximately 1.25 Watts of continuous power. These values represent those that might be found in an implementation that uses a single divider circuit to provide power and voltage measurement.

Figure 7:
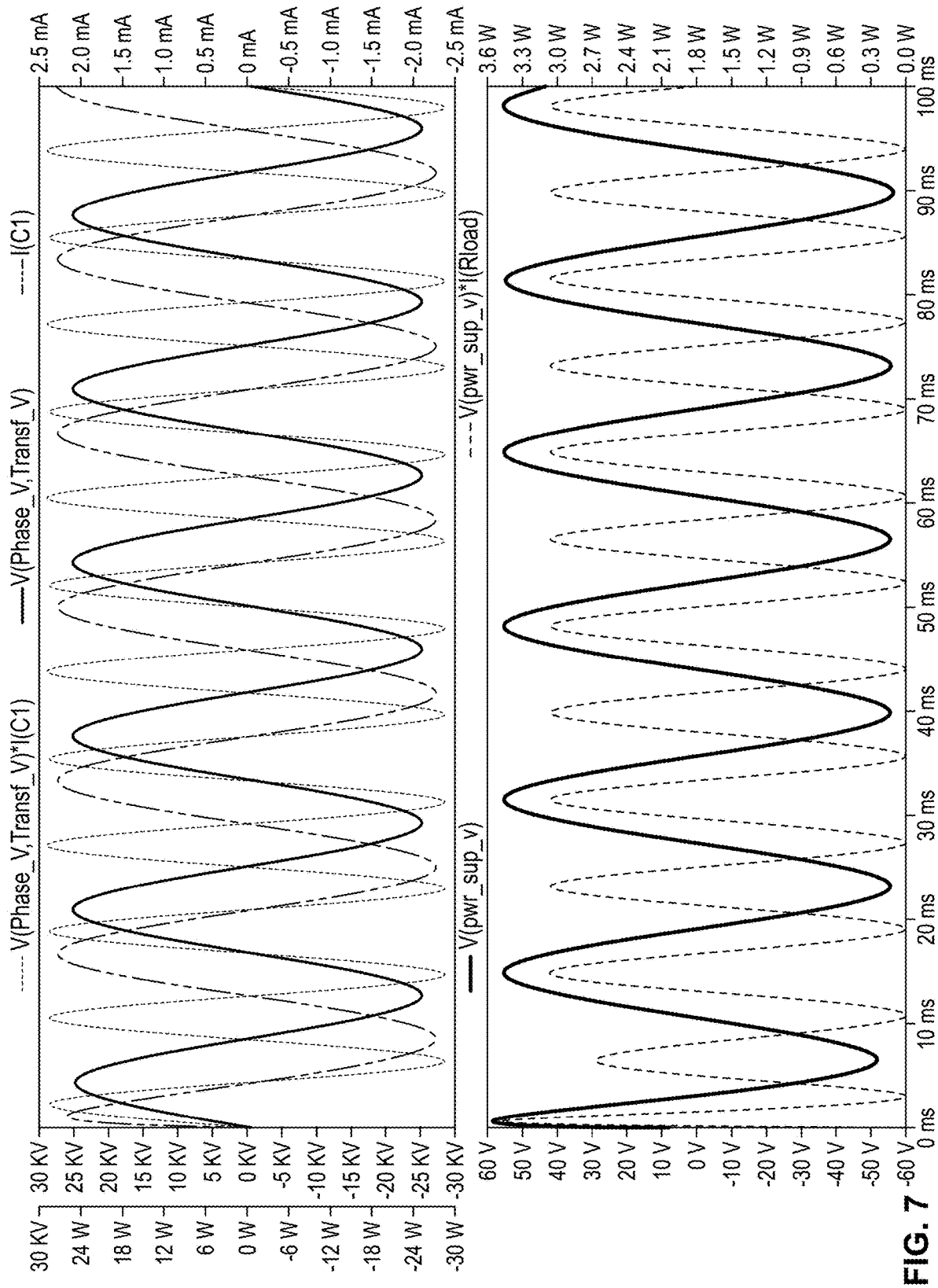

In the event that the single resistive divider design does not meet either the continuous available power requirement or the voltage measurement accuracy requirement of the monitoring device, then a second capacitive divider can be implemented to source system power for the device. Simulation results for the example capacitive divider shown in FIG. 5 are shown in FIG. 7. The system parameters in this simulation are the same as above with respect to the resistive divider, and similar voltages are present across the primary divider element (C1). Note that the ideal capacitor, C1 has no real power dissipation, and therefore, no heating. This will not be zero in real capacitors, but the dissipation could be kept as small as practically required. The available continuous power in this example is 3 Watts peak or 1.5 Watts continuous rms.

As previously mentioned, the proposed device is designed to support a specific utility network system voltage class. This may limit the range of voltage that could appear across the power transformer primary and the transformer would be designed such that this range of voltages would be supported inductively for efficient transformer operation. The voltage across the transformer primary will vary with the current drawn by the transformer and its load. For a single voltage divider design that is used for both power harvesting and voltage measurement, this ideally requires a fixed resistive load, that is, a load that dissipates a fixed power at a constant AC source voltage. This could be implemented by a number of possible circuits, for example, power factor correction (PFC) circuitry configured to appear as a resistive load on an AC source. The DC output of the circuit would include a secondary control system that maintained a constant current draw on the fixed DC source. If the device is designed with two dividers, the power harvesting divider could operate in a much cruder fashion, that is, allow the transformer core to saturate with light device loads. The current through the divider, and the voltage on the transformer primary winding in this case would be highly nonlinear and not easily useable for phase voltage measurement. It may also be a significant noise source that may be difficult to attenuate.

The device will need to be able to survive the typical transient and system fault events seen in utility networks. These include switching transient events associated with either normal switching events, for example, load transfer switching or capacitor bank switching, or they can be sourced from a fault event, for example, recloser or circuit breaker operation. Each voltage divider element (110 and 112 in FIG. 1A) would be preferably designed to support the full phase-to-phase system voltage to ensure safe operation with an exposed wire (114 in FIG. 1A) or with a wire that becomes exposed after the device becomes damaged. The device will also need to survive lightning impulse events and will be tested to certify a specified BIL rating. These transient events include significant energy with frequency components far in excess of normal power frequencies (50 or 60 Hz). All of the resistive and capacitive elements of the divider will need to be designed to dissipate the energy associated with these events. The power transformer primary winding will need to be protected from overvoltage and it is anticipated that this would be accomplished using available over-voltage protection devices, for example, MOVs, TVS devices, spark gaps, etc. In this regard, a purely capacitive divider would be capable of sourcing extremely large currents, albeit for a very brief time. Divider network series resistance components may be desirable to limit this current in this case. The added series resistance would favorably be distributed throughout the length of the divider to more evenly distribute the E-field gradients created during the transient voltage fault event.

Figure 8A:
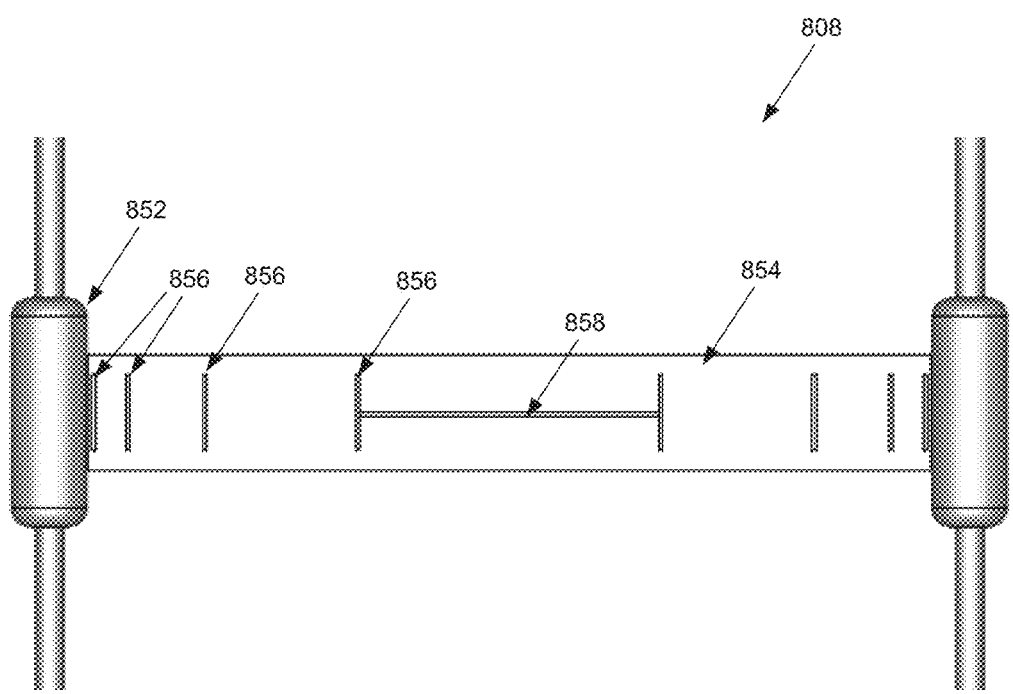
FIGS. 8A-8F illustrate how a voltage divider influences surrounding potential field of an electrical power grid.

FIGS. 8A-8F illustrate a simple voltage divider design showing how a typical divider influences the surrounding potential field of an electrical power grid. FIG. 8A shows a voltage divider 808 with cylindrical divider shells 852. The divider includes a dielectric substrate 854, equipotential surfaces 856, and wire 858.

Figure 8B:
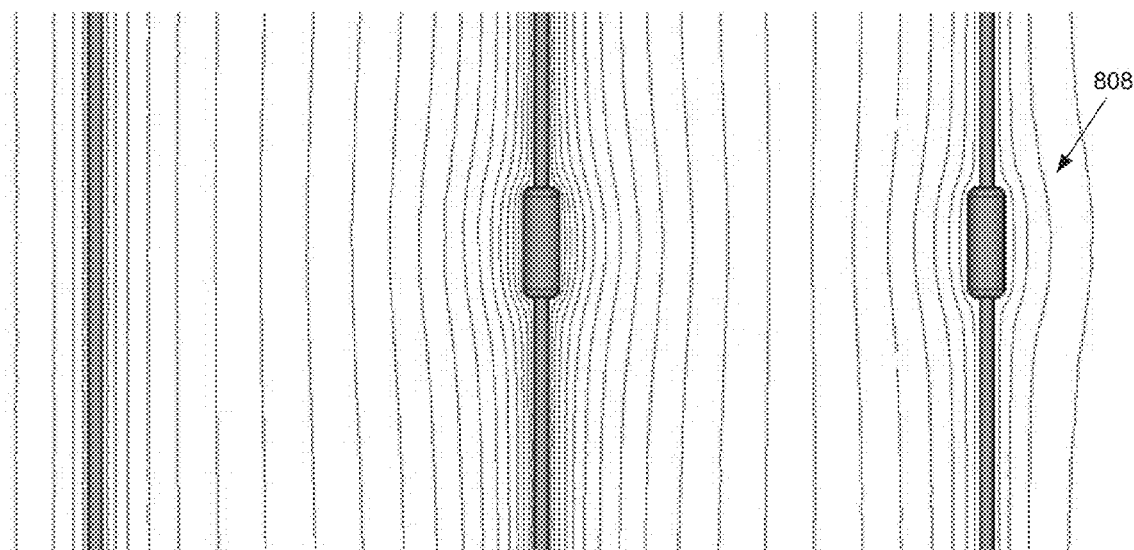
Figure 8C:
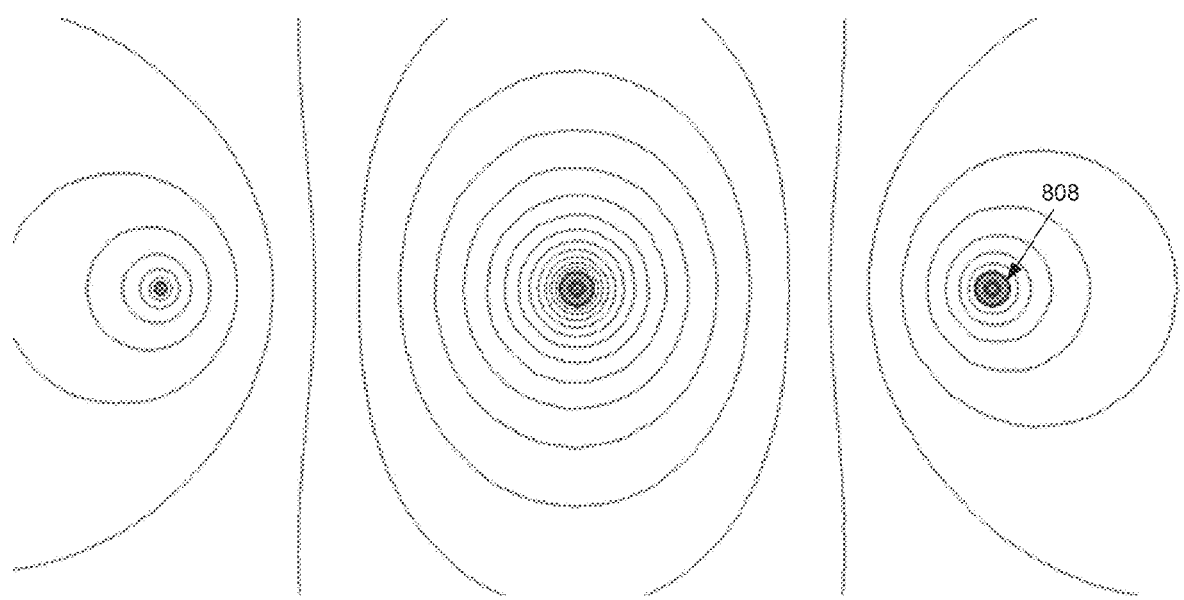

FIGS. 8B-8C show top and side views, respectively, of equipotential lines for a three conductor system having a voltage divider shells, with the conductor sources set as follows:

Far left conductor: −1 p.u. volt
Center conductor: 2 p.u. volt
Far right conductor: −1 p.u. volt FIGS. 8B-8C illustrate the behavior for the "incumbent field", although the diagrams include voltage divider shells on the two rightmost conductors to illustrate how they affect the field.

Figure 8D:
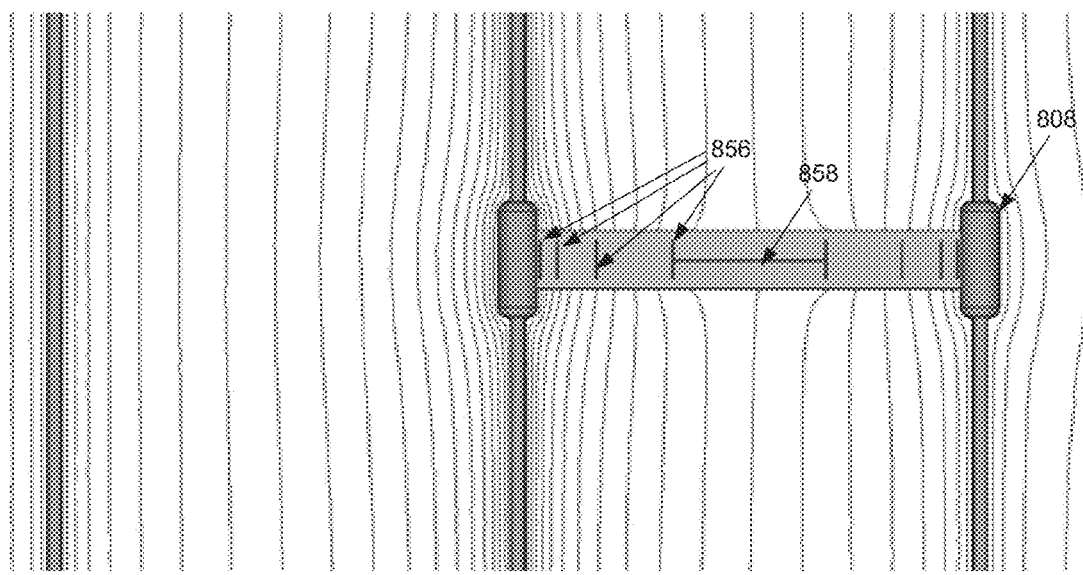

FIG. 8D shows the equipotential lines as they are influenced by the equipotential surfaces 856 and the wire 858 when those conductive objects are floating. Note the field is only changed adjacent to the center wire and the two connected equipotential surface elements.

Figure 8E:
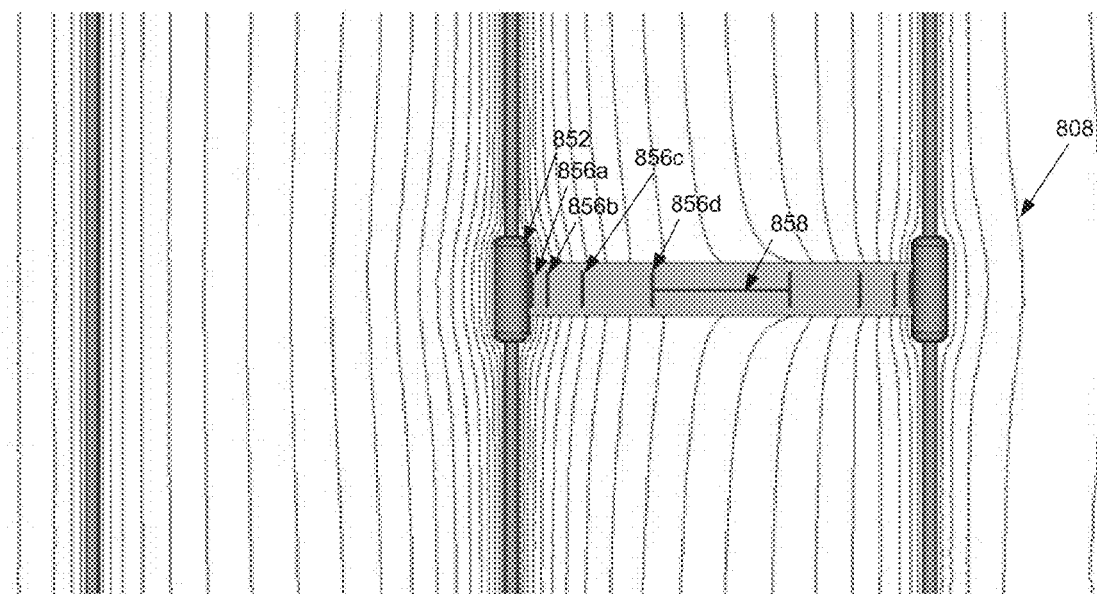

FIG. 8E shows the equipotential lines for a divider design with realistic resistances between each of the equipotential surfaces. The following resistances were used:

Between divider shell 852 and equipotential surface 856*a*: 659

Between equipotential surface 856*a* and equipotential surface 856*b*: 2880

Between equipotential surface 856*b* and equipotential surface 856*c*: 3540

Between equipotential surface 856*c* and equipotential surface 856*d*: 3520

Figure 8F:
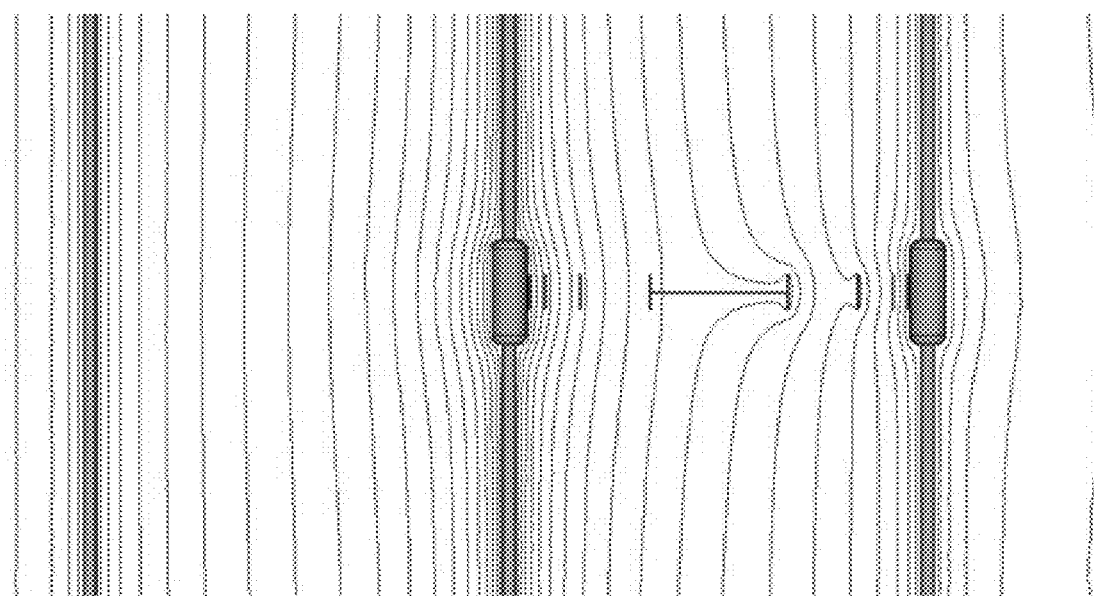

Note how the potential field is most significantly influenced in the center area surrounding the wire 858. This is where the field is the lowest amplitude. FIG. 8F shows the same result with the dielectric substrate removed from the view.

The areas where the field is pinched in toward the conductor will experience increased E-field gradients versus the incumbent field. Areas where the field is pinched away from the conductor experience decreased E-field gradients versus the incumbent field. Note the areas with increased E-field gradients surround the lower potential conductor and the max gradient in that area will be less than the max gradient surrounding the higher potential conductor.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural references unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A power line monitoring system, comprising:
a first voltage divider element configured to be attached to a first conductor;
a second voltage divider element configured to be attached to a second conductor;
a wire connected to the first voltage divider element and the second voltage divider element, the wire having a variable length to adjust a distance between the first voltage divider element and the second voltage divider element; and
a processor electrically coupled to the first voltage divider element and the second voltage divider element, the processor being configured to monitor a voltage of the first and second conductors.

2. The system of claim 1, wherein the first voltage divider element is attached to the first conductor with a first clamp, and wherein the second voltage divider element is attached to the second conductor with a second clamp.

3. The system of claim 1, further comprising a silicon overmold configured to protect the power line monitoring system from moisture.

4. The system of claim 1, wherein the processor is configured to sample current through the wire to calculate a phase-to-phase voltage.

5. The system of claim 1, further comprising power harvesting electronics configured to harvest energy from the first or second conductor to provide power to the power line monitoring system.

6. The system of claim 1, wherein the first and second voltage divider elements comprise a mix of resistive and capacitive voltage divider elements.

7. The system of claim 6, wherein the resistive voltage divider elements are used by the processor to monitor the voltage, and wherein the capacitive voltage divider elements are configured to provide power to the power line monitoring system.

8. The system of claim 1, wherein the wire is coiled.

9. The system of claim 1, wherein the wire is shaped as a spring.

10. The system of claim 1, wherein the wire comprises at least a first wire and a second wire.

11. The system of claim 10, wherein the processor is configured to sample current through at least the second wire to calculate a phase-to-phase voltage.

12. The system of claim 1, wherein the wire is rigid.

13. The system of claim 1, wherein the wire is insulated.

14. The system of claim 1, further comprising a power harvesting voltage divider that comprises
   a third voltage divider element configured to be attached to the first conductor and
   a fourth voltage divider element configured to be attached to the second conductor, wherein the third and fourth voltage divider elements are configured to provide power to the power line monitoring system.

15. The system of claim 1, further comprising a divider conductor shell formed from a conductive material and configured to be positioned around the first conductor.

16. The system of claim 15, wherein the divider conductor shell comprises a clam shell structure configured to be closed over the first conductor.

17. The system of claim 15, wherein the divider conductor shell has a semicircular shape.

18. The power line monitoring system of claim 1, wherein the first voltage divider element includes one or more first equipotential surfaces and the second voltage divider element includes one or more second equipotential surfaces.

19. The power line monitoring system of claim 18, further comprising a first insulator that encapsulates the one or more first equipotential surfaces and at least a first portion of the wire; and a second insulator that encapsulates the one or more second equipotential surfaces and at least a second portion of the wire.

20. A power line monitoring system, comprising:
   a voltage divider configured to be attached to a first conductor and a second conductor, the voltage divider comprising:
      a first conductive shell configured to be positioned around the first conductor;
      a first voltage divider element configured to be attached to the first conductor;
      a second conductive shell configured to be positioned around the second conductor;
      a second voltage divider element configured to be attached to the second conductor;
      a wire connected to the first voltage divider element and the second voltage divider element, the wire having a variable length to adjust a distance between the first voltage divider element and the second voltage divider element; and
   a processor electrically coupled to the first voltage divider element and the second voltage divider element, the processor being configured to monitor a voltage of the first and second conductors.

21. The power line monitoring system of claim 20, wherein the first conductive shell is attached to one or more first equipotential surfaces and the second conductive shell is attached to one or more second equipotential surfaces.

22. The power line monitoring system of claim 21, further comprising a first insulator that encapsulates the one or more first equipotential surfaces and at least a first portion of the wire; and a second insulator that encapsulates the one or more second equipotential surfaces and at least a second portion of the wire.

* * * * *